United States Patent
Shureb

[19]

[11] Patent Number: 6,161,837
[45] Date of Patent: Dec. 19, 2000

[54] PISTON RING WITH HYBRID FACE COATING

[75] Inventor: Robert Francis Shureb, Farmington Hills, Mich.

[73] Assignee: Detroit Diesel Corporation, Detroit, Mich.

[21] Appl. No.: 09/078,434

[22] Filed: May 14, 1998

[51] Int. Cl.$^7$ ....................................................... F16J 9/26
[52] U.S. Cl. ............................................. 277/443; 277/444
[58] Field of Search ..................................... 277/443, 444

[56] References Cited

U.S. PATENT DOCUMENTS

| | | |
|---|---|---|
| 3,857,682 | 12/1974 | White . |
| 4,579,355 | 4/1986 | Kooroki ................................ 277/443 |
| 5,154,433 | 10/1992 | Naruse . |
| 5,226,975 | 7/1993 | Denton . |
| 5,316,321 | 5/1994 | Ishida et al. . |
| 5,405,154 | 4/1995 | Tsuchiya et al. ..................... 277/443 |
| 5,582,414 | 12/1996 | Miyazaki et al. ..................... 277/444 |
| 5,605,741 | 2/1997 | Hite et al. ............................. 277/443 |
| 5,718,437 | 2/1998 | Tanaka et al. ........................ 277/443 |
| 5,820,131 | 10/1998 | Tanaka et al. ........................ 277/443 |

FOREIGN PATENT DOCUMENTS 62-188856  5/1987  Japan .

OTHER PUBLICATIONS

"Effects of Surface Treatments on Piston Ring Friction Force and Wear"—*SAE Technical Paper Series*—Yoshida Et Al, Mar. 1990.

Plankert Et Al., "Topography of the Running Surface of Piston Rings—A Tribological Investigation" Engineering Data, Undated.

Advanced Surface Treatments; Beam Alloy Corporation, Undated.

Ion Beam Deposited Hard Chrome—Chromion Beamalloy Corporation, Undated.

Deutchman Et Al "Ion Beam Enhanced Deposition of Hard Chrome Coatings"—Beamalloy Corporation, Jan. 1993.

Deutchman Et Al "Ion Beam Enhanced Deposition of Conductive Metallic Coatings"—Beamalloy Corporation, Jan. 1993.

Piston Ring Coatings and Liner Technology Update—Perfect Circle Products Division of Dana Corporation, Nov. 1995.

Thin Film Coatings Make Auto Parts Super Tough—R&D Magazine, Mar. 1996.

Fixed Deflection Fatigue Machine (Model VSP–150), Oct. 1995.

*Primary Examiner*—Anthony Knight
*Assistant Examiner*—John Beres
*Attorney, Agent, or Firm*—Bill C Panagos

[57] ABSTRACT

An improved piston ring is disclosed, together with a process form making the ring. An annular steel base body has a lower layer formed by electro-plating a peripheral surface of the body with either a chromium or titanium nitrided gas. The ring is normally lapped until dull, smooth and free of residual metallic plating nodules, yielding random micro-abrasions in the lower layer. An upper layer of metallic nitride or chromium ceramic is formed onto the lapped lower layer, using physical vapor deposition means.

14 Claims, 2 Drawing Sheets

PISTON RING WITH HYBRID FACE COATING

TECHNICAL FIELD

The present invention relates to a piston ring, more particularly, to a ring having an outer peripheral surface with a lower plated layer of chromium and an upper layer, usually a metallic nitrided layer, applied to the inner layer.

BACKGROUND OF THE INVENTION

Piston rings with an electro-chemically applied chrome plated peripheral surface, are known in the art as forming a base for a metallic nitrided face coating. The face coatings complement the hard chrome plate layer by providing advantages not possessed by the said layer, such as strong scuff resistance, extremely high hardness, and low coefficient of friction.

Such metallic nitrided face coatings, however, result in undesirable side effects and limitations, despite the desirable advantages noted above. Because these face coatings may lack strong enough bonds with the underlying substrate, the face coatings can chip so that appropriate coating thickness fails to be achieved. Notwithstanding a suitable substrate, often there is insufficient surface area between the coating and the substrate to promote the necessary bonds. Furthermore, while the wear and scuff resistance of such metallic nitrided face coatings is far superior to chrome plate, current processing methods are unable to produce a layer of sufficient thickness to provide satisfactory wear life in a diesel engine.

SUMMARY OF THE INVENTION

An improved piston ring is described, having a steel base body defining an annular shape with at least an outer peripheral face. The outer face is formed by the steps of plating a lower layer of chromium onto the peripheral surface of the base body by electro-chemical deposition. The plated ring is lapped by the step of containing and agitating the ring in an abrasive slurry until substantially all residual nodules of the plated metal are removed, producing a smooth, dull plated surface containing micro-abrasions. An upper layer of a metallic nitrided or metallic ceramic coating is then formed on the lapped, plated ring by physical vapor deposition.

A process of making a piston ring is described, which includes the steps of providing an annular steel base body having an outer peripheral face, plating the peripheral face with chromium to form a lower layer by electrochemical deposition and lapping the lower layer by treating the ring in an abrasive slurry until the lower layer is substantially smooth and free of plated nodules, forming micro-abrasions in the lower layer. An upper layer is formed on the lapped lower layer by applying a metallic nitrided gas or metallic ceramic coating by physical vapor deposition.

In a preferred embodiment, the step of applying a lower, chrome plated layer further includes applying the plating to a thickness of from 0.004 to 0.012 inches. In another preferred embodiment, the step of applying the upper layer further includes depositing a coating thickness of from 4 to 50 microns on the lower layer. In another preferred embodiment, the step of applying the upper layer includes depositing a coating of chromium ceramic. In another preferred embodiment, the steps of applying the upper layer includes depositing a coating selected from the group consisting of titanium and chromium nitrided gases. In another preferred embodiment, a chromium ceramic coating is deposited as the upper layer.

An improved piston ring is described, including an annular steel base body having an outer peripheral face with a lower layer and an upper layer. The lower layer is a chrome plating, lapped to be substantially smooth and free of nodules, and having micro-abrasions. The upper layer is a metallic nitrided or ceramic coating, deposited on the lapped lower layer.

In a preferred embodiment, the lower layer has a plating thickness of from 0.004 to 0.012 inches. In another preferred embodiment, the upper layer has a coating thickness of from 4 to 50 microns. In another preferred embodiment, the upper layer contains a material selected from the group consisting of titanium and chromium nitrides. In another preferred embodiment, the upper layer is a chromium ceramic deposited on the lapped lower layer.

An improved piston ring is described, having a steel base body defining an annular shape with at least an outer peripheral face. The outer face is formed by the steps of plating a lower layer of chromium onto the peripheral surface of the base body by electro-chemical deposition. The plated ring is lapped by the step of containing and agitating the ring in an abrasive slurry until substantially all nodules of the plated metal are removed, producing a smooth, dull plated surface containing micro-abrasions. An upper metallic nitride layer is then formed on the lapped, plated ring by physical vapor deposition.

The lower, lapped layer has uniform thermal properties and forms a stable bond with the upper layer, due to the micro-abrasions which further enhance lubrication properties of the ring in use.

BRIEF DESCRIPTION OF THE DRAWINGS

The features and inventive aspects of the present invention will become more apparent upon reading the following Detailed Description, Claims, and Drawings, of which the following is a Brief Description:

DETAILED DESCRIPTION

Figure 1:
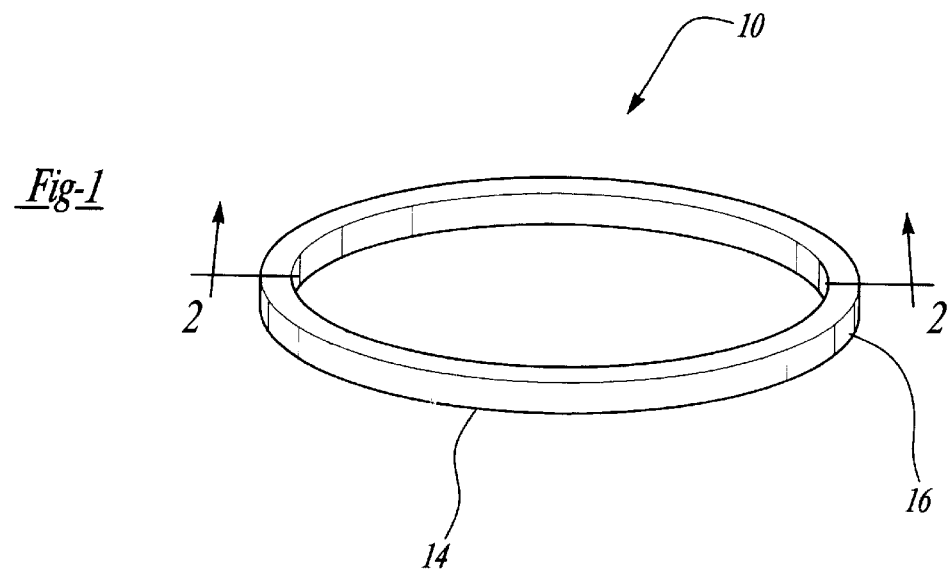
FIG. 1 is a perspective view of a piston ring, according to the present invention.
Figure 2:
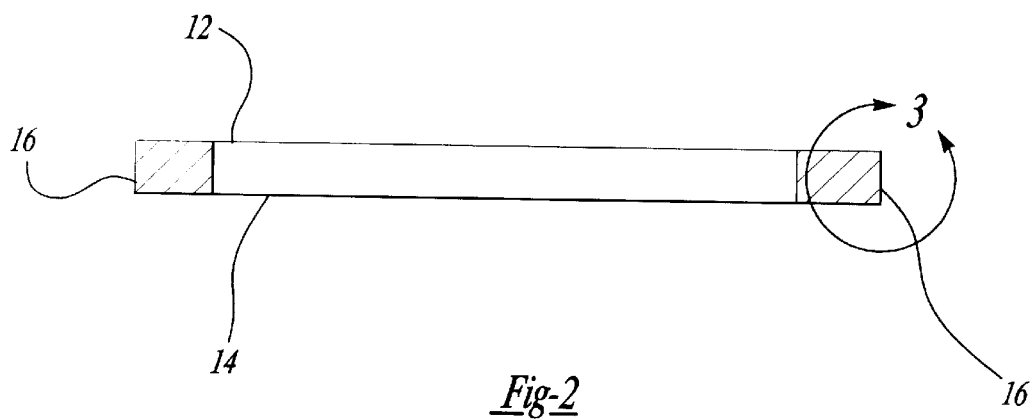
FIG. 2 is a cross-sectional view of the piston ring shown in FIG. 1, taken along the lines 1—1.
Figure 4:
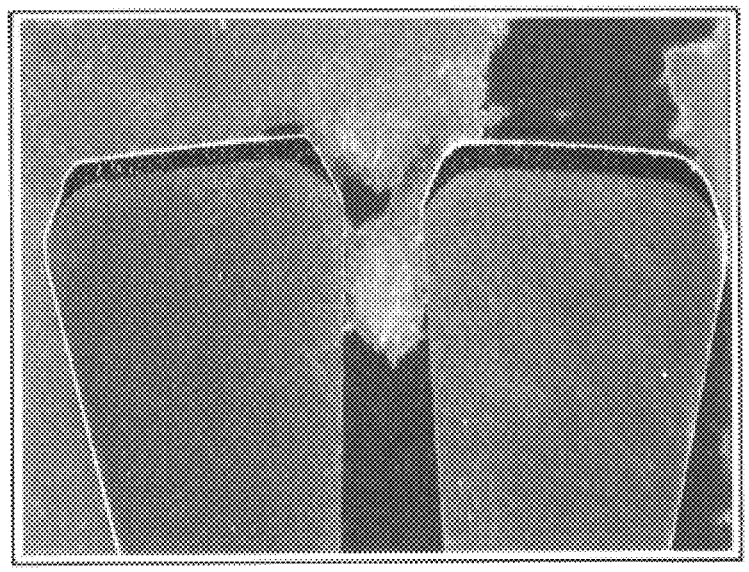
FIG. 4 is an enlarged cross sectional photograph of a lower layer formed in accordance with the present invention.

According to FIGS. 1–2, a piston ring of the present invention is generally shown having the form of an annular steel base body 10. The body 10 has opposed axial surfaces 12, 14 and an outer peripheral face 16, including a lower layer 18 and an upper layer 20. The lower layer 18 consists of electro-chemical plated chromium, lapped to be substantially smooth and free of nodules, and having micro-abrasions as shown in FIG. 4. The upper layer 20 consists of a metallic nitride deposited on the lapped lower layer 18. The upper layer 20 contacts an internal wall of a cylinder (not shown) in actual use. It is intended that the plating, lapping and deposition of the respective layers 18, 20 be performed according to various methods that will hereafter be described.

Referring to FIG. 2, the base body 10 is made from steel or cast iron, preferably a steel alloy which is a martensitic stainless steel having between 0.3 and 0.8 percent chromium by weight and between 0.10 and 0.90 percent carbon by weight. The lower layer 18, applied to at least the outer peripheral face 16, preferably has a hardness of 800 to 1200 Hardness Vickers Number ("HVN") and a minimum preferred depth of thickness of 0.004 inches (0.101 mm). The method of plating the lower layer 18 on the peripheral face 16 is accomplished using conventional electroplating methods well known to those skilled in the art, specifically electro-chemical deposition. Preferably, the lower layer 18 is composed of a chromium plating having a thickness from about 0.004 to about 0.012 inches.

Subsequent to forming the lower layer 18, the lower layer is subjected to a normal lapping process which yields the desirable geometry favorable to developing an oil film between the piston ring and cylinder liner. In summary, the normal lapping process of the present invention involves placing the base body 10, onto which the lower layer 18 has been plated, into a vessel containing a moving slurry of abrasive particles. After a desirable period of agitation, the slurry produces a dull, smooth finish on layer 18, creating random micro-abrasions in the topography of the layer. Grinding the lower layer is an acceptable alternative to lapping, to remove the chrome nodules and to form the desired geometry.

By way of background, other well-known lapping procedures have been used to finish chromium, to remove nodules and provide a suitable surface for wear resistance of a piston ring. Such methods include knurling, porous plating, forming holes in the surface using lasers, sand blasting and the like, as described in ENGINEERING DATA, *"Topography of the Running Surface of Piston Rings—a Tribological Investigation"*, the entire disclosure of which is expressly incorporated by reference herein and relied upon. Another procedure, known as "face-lapping", utilizes a metal lap run over the relevant surface, forming vertical striations or channels; thereafter, in the approach first-noted above, the surface is grit-blasted to yield irregularities which function as reservoirs for oil to escape the piston ring. Regardless of the method of lapping the lower chrome layer, the present invention provides enhanced wear resistance and resistance to scuffing.

Once normal lapping of lower layer 18 is completed, the upper metallic nitride layer 20 is applied to the lapped lower layer. Upper layer 20 has a preferred hardness of 2000 to 3000 HVN and more preferably approximately 2600 HVN. Upper layer 20 has a preferred case depth or thickness of from about 4 to 50 microns. Layer 20 should exhibit little or no porosity, a low coefficient of friction, high hardness and strong scuff resistance.

Because of the normal lapping procedure used on lower layer 18, there is a strong bond established between layer 18 and the upper layer 20, thus offering the advantage of improved resistance to chipping while the piston ring is in operation.

A preferred upper layer 20 consists of either titanium nitride or chromium nitride. Each of these metallic nitrides has a high bond strength with the lower layer 18 resulting from the method of forming the upper layer 20, according to the procedure given below. In particular, a chromium nitride upper layer 20 has low internal stress, which resists chipping and allows greater application thickness. Further, chromium nitride has excellent compatibility when bonded with the lower layer 18 when layer 18 is formed from electroplated chrome. Another preferred upper layer 20 consists of titanium nitride.

Metallic nitride can be formed starting with a metallic source, e.g., chromium or titanium, which is then evaporated to yield metallic vapor in a zone between the metallic source and lower layer 18. A nitrogen gas is then introduced into the zone, which reacts with the metallic vapor to form a metallic nitride having metallurgically tight bonds. This metallic nitride is then deposited onto the lapped lower layer 20 to create the upper layer 20. Layer 20 has no porosity, as compared to those interstitial spaces presented by other types of layers formed using plasma applied coatings.

Upper layer 20 may particularly be applied by using a technique known as "Arc Physical Vapor Deposition", a type of electroplating process. Body 10, with lapped lower layer 16, is placed in a vacuum furnace. Polarity is established between a plating metal, such as chromium or titanium, and body 10. The body 10 acts as a negatively charged cathode and the plating metal acts as a positively charged anode. The vaporized plating metal interacts with a reactive gas containing nitrogen to form a metallic nitride which is then deposited onto lapped lower layer 18. Chromium and titanium have been found to be especially good plating metals, yielding a metallic nitride having the desired thickness. In operation, about 10 microns per hour of the upper layer 20 may be deposited in this manner. Practice of this method utilizes about 100 amps with a voltage differential of about 20 volts, while temperature of the body 10 should not exceed 800 degrees Fahrenheit. The temperature of body 10 may have to be limited to about 550 degrees Fahrenheit, to prevent permanent distortion due to thermal effects.

Application of upper layer 20 to the lapped lower layer 18 results in an outer surface 22 having a preferred convex surface profile between about 0.0002 and about 0.0010 inches (0.005 millimeters and 0.03 millimeters), as measured between an apex 24 of the surface 22 and either a lower or upper transition point 26 defined between outer surface 22 and the corresponding axial surfaces 12, 14. Such a convex surface profile promotes development of an oil film between surface 22 and a corresponding cylinder wall. This oil layer avoids undesirable wear between surface 22 and the wall during periods of boundary layer lubrication and enhances scuff resistance during the break-in period of the piston ring and cylinder liner.

Figure 3:
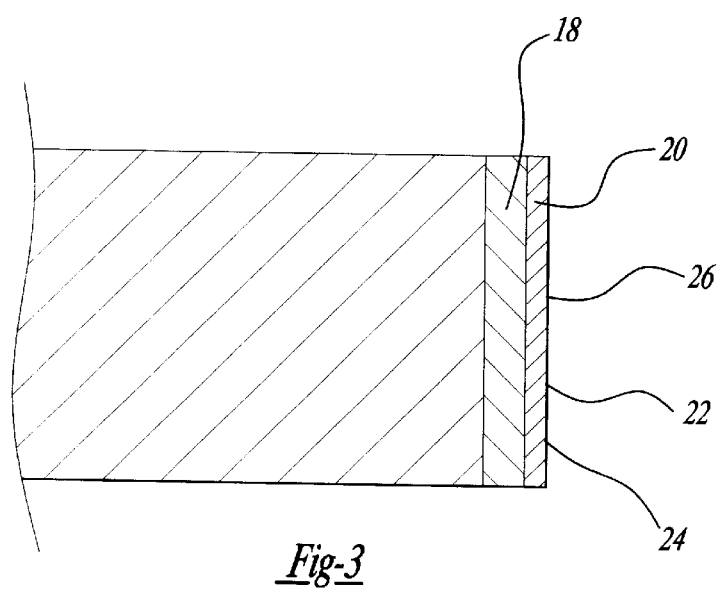
FIG. 3 is an enlarged cross-sectional view of a portion of the piston ring within the encircled region 3 of FIG. 2.
Figure 5:
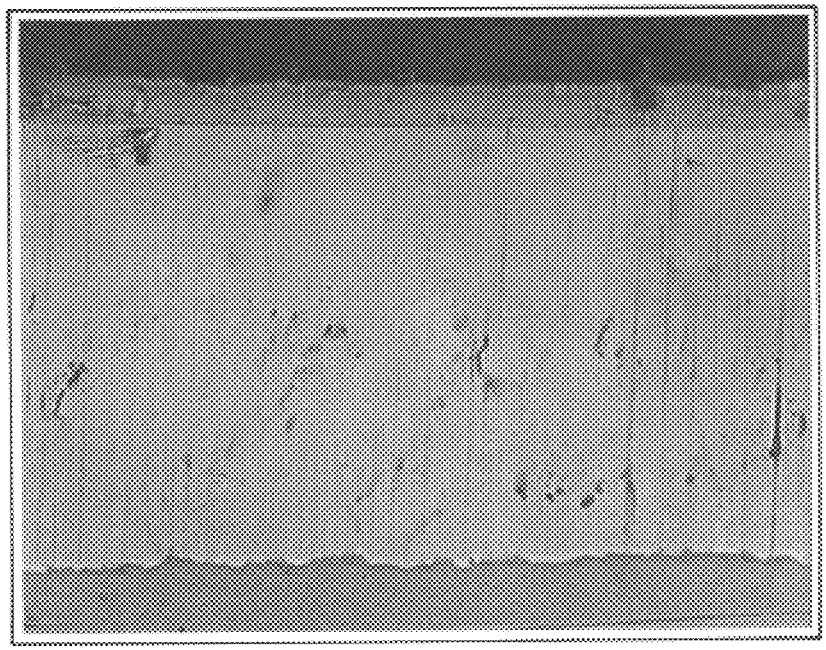
FIG. 5 is a photo micrograph of the piston ring shown in FIG. 4 showing a cross section of the annular piston ring body, the chrominum layer and the metallic nitride layer.

FIG. 4 is a cross sectional photograph of the piston ring depicted in FIG. 3. It can be seen that the chromium and metallic nitride layer are deposited in sequential layers upon the prepared annular body. A reference to FIG. 5 shows a photo micrograph of the piston ring of FIG. 4, showing the discreet layers upon the annular body. Specifically, the steel body has a chromium plate layer deposited thereon, and the metallic nitride layer is deposited on the Chromium layer in the sequence described in the description of FIG. 3.

Although certain preferred embodiments of the invention have been disclosed, it will be appreciated by those ordinarily skilled in the art that particular modifications would come to mind, without departing from the scope of the present invention. Therefore, in ascertaining the actual scope and content of this invention, the following Claims should be studied.

I claim:

1. A piston ring comprising: an annular steel or iron base body having an outer peripheral face, a lower layer and an upper layer, the lower layer being a chrome plate, normally lapped to be substantially dull, smooth and free of nodules, said lower layer having micro-abrasions, wherein the upper layer is a metallic nitride or metallic ceramic coating deposited on the lapped lower layer.

2. The piston ring of claim 1 wherein the lower layer has a plating thickness of from 0.004 to 0.012 inches.

3. The piston ring of claim 1 wherein the upper layer has a coating thickness of from 4 to 50 microns.

4. The piston ring of claim 1 wherein the upper layer contains a material selected from the group consisting of titanium and chrome nitrides.

5. The piston ring of claim 1 wherein the upper layer is a chromium ceramic layer formed on the lapped lower layer.

6. A piston ring comprising: an annular steel base body having an outer peripheral face, a lower layer and an upper layer, the lower layer being an electro-chemical chromium plating having a thickness of from 0.004 to 0.012 inches which is normally lapped to be substantially dull, smooth and free of nodules, said lower layer having micro-abrasions, wherein the upper layer is chromium ceramic coating deposited to a thickness of from 4 to 50 microns on the lapped lower layer.

7. The piston ring of claim 6 further comprising an outer convex surface adapted for contact with a cylinder wall.

8. A process of making a piston ring, comprising the steps of: a) providing an annular steel base body having an outer peripheral face; b) plating at least the peripheral face with a lower layer of chromium by electrochemical deposition; c) lapping the lower layer by treating the ring with an abrasive slurry until the lower layer is substantially smooth and free of plated nodules, forming micro-abrasions in the lower layer; and d) forming an upper layer of a metallic nitride or ceramic metal coating on the lapped lower layer by physical vapor deposition.

9. The process of claim 8 wherein step b) further comprises applying the lower layer to a plating thickness of from 0.004 to 0.012 inches.

10. The process of claim 8 wherein step d) further comprises depositing the upper layer to a coating thickness of from 4 to 50 microns.

11. The process of claim 8 wherein step d) further comprises depositing a nitrided chromium or titanium coating.

12. The process of claim 8 wherein step d) further comprises depositing a chromium ceramic coating.

13. A process of making a piston ring, comprising the steps of: a) providing an annular steel base body having an outer peripheral face; b) plating at least the peripheral face with a lower layer of chromium by electrochemical deposition, to a thickness of from 0.004 to 0.012 inches; c) lapping the lower layer by treating the ring with an abrasive slurry until the lower layer is substantially smooth and free of plated nodules, forming micro-abrasions in the lower layer; and d) forming an upper layer of a chromium ceramic coating, having a thickness of from 4 to 50 microns, on the lapped lower layer by physical vapor deposition.

14. A piston ring, of the type having a steel base body defining an annular shape with at least an outer peripheral face, formed by the steps of: a) plating at least the peripheral face with a lower layer of chromium by electro-chemical deposition, to a thickness of from 0.004 to 0.012 inches; b) lapping the lower layer by treating the ring with an abrasive slurry until substantially all nodules of the plated metal are removed, producing a smooth, dull, surface containing micro-abrasions; and c) forming an upper layer of a chromium ceramic coating with a thickness from 4 to 50 microns on the lapped lower layer by physical vapor depositions.

\* \* \* \* \*